SEMI-CONDUCTOR MATERIALS

Filed March 15, 1956

INVENTOR.
DIETRICH A. JENNY
BY J. L. Whittaker
ATTORNEY 2,809,165

SEMI-CONDUCTOR MATERIALS

Dietrich A. Jenny, Princeton, N. J., assignor to Radio Corporation of America, a corporation of Delaware Application March 15, 1956, Serial No. 571,808

12 Claims. (Cl. 252—62.3)

This application is a continuation-in-part of application Serial No. 323,313, filed November 29, 1952.

This invention relates to novel semi-conducting materials and devices, and to methods for making both. More particularly, the invention relates to novel n-type semi-conductive materials such as germanium and silicon, the novelty residing in the use of different conductivity type-determining impurities than previously used for preparing these materials.

The electrical properties of semi-conductors such as germanium and silicon are well known. One of the principal advantages of such semiconductors is the ability to have formed in bodies thereof rectifying junctions which are capable of performing electrical functions hitherto done primarily by electron vacuum tubes. One well known type of device for performing these functions is a transistor. Another is a diode rectifier. For the production of satisfactory transistors and rectifiers the resistivity of the semiconductive body is relatively critical. Germanium and silicon in highly pure states are not generally useful for such devices because their electrical restivity is too high. For example, it has been theoretically determined that the resistivity of absolutely pure germanium at room temperature is of the order of 60 ohm-cm. which is considerably above the generally useful range for transistors, i. e., about 0.1 to 10 ohm-cm. For diode rectifier devices the useful resistivity is between 0.003 to 0.01 ohm-cm. Intrinsically pure silicon has a resistivity of about 60,000 ohm-cm.

The conductivity of germanium and silicon may be increased by adding thereto trace amounts of conductivity-type-determining impurities. The processes for introducing such impurities into semiconductive materials are collectively termed "doping." The conductivity of the semiconductor may be increased by these impurities in two ways, depending upon the type of charge carrier provided by the impurity as determined by the atomic structure of the impurity in relation to the atomic structure of the semiconductor. Thus an impurity whose atoms are capable of giving up electrons in a particular semiconductor crystal is termed a "donor" or "n-type" (negative) impurity, and a semiconductor so doped is deemed to be of "n-type" (negative) conductivity. On the other hand, a substance whose atoms are capable of borrowing or accepting electrons in a particular host semiconductor is termed an "acceptor" or "p-type" (positive) impurity, and a semiconductor so doped is deemed to be of "p-type" conductivity. Transistor operation is believed to be largely dependent upon an excess of one type of charge carriers over the other. A semiconductor may, of course, contain both types of conductivity-determining impurities and the type of conductivity of such a semiconductor is determined by the impurity in excess. Thus the conductivity of such a body may be changed back and forth from n-type to p-type several times before the resistivity of the body eventually becomes so low that the body loses its semiconducting character.

In order to form a rectifying barrier or junction in a semiconductor, it is necessary to provide two adjacent semiconducting regions within the body, one region being of p-type conductivity and the other of n-type conductivity. Between the two regions exists a third, relatively small, transition region which is referred to as a rectifying junction or barrier. If the whole body of semiconducting material conducts principally by means of one type conductivity only, no rectifying junction is formed within it.

It is an object of this invention to provide an improved semiconductor material.

Another object of the invention is to provide novel n-type semiconducting materials containing different conductivity-type-determining impurities than heretofore known or utilized.

Another object of the invention is to provide an improved method for establishing n-type conductivity in germanium or silicon single crystals.

Another object is to provide a novel semiconductor diode utilizing n-type germanium or silicon.

Yet another object is to provide within a body of p-type germanium or silicon a region of n-type conductivity and an improved p-n rectifying junction between this region and the remainder of the body.

A further object is to provide an improved method of creating a p–n rectifying junction within a body of p-type germanium or silicon.

Previously it has been known that a number of elements such as phosphorus, arsenic, antimony, and bismuth are n-type impurities in germanium and silicon. It has now been discovered, according to the present invention, that sulfur, selenium and tellurium also constitute n-type conductivity-type-determining impurities in germanium and silicon.

DOPING GERMANIUM AND SILICON

Figures 1, 2, 3, 4, 5, 6, 7:
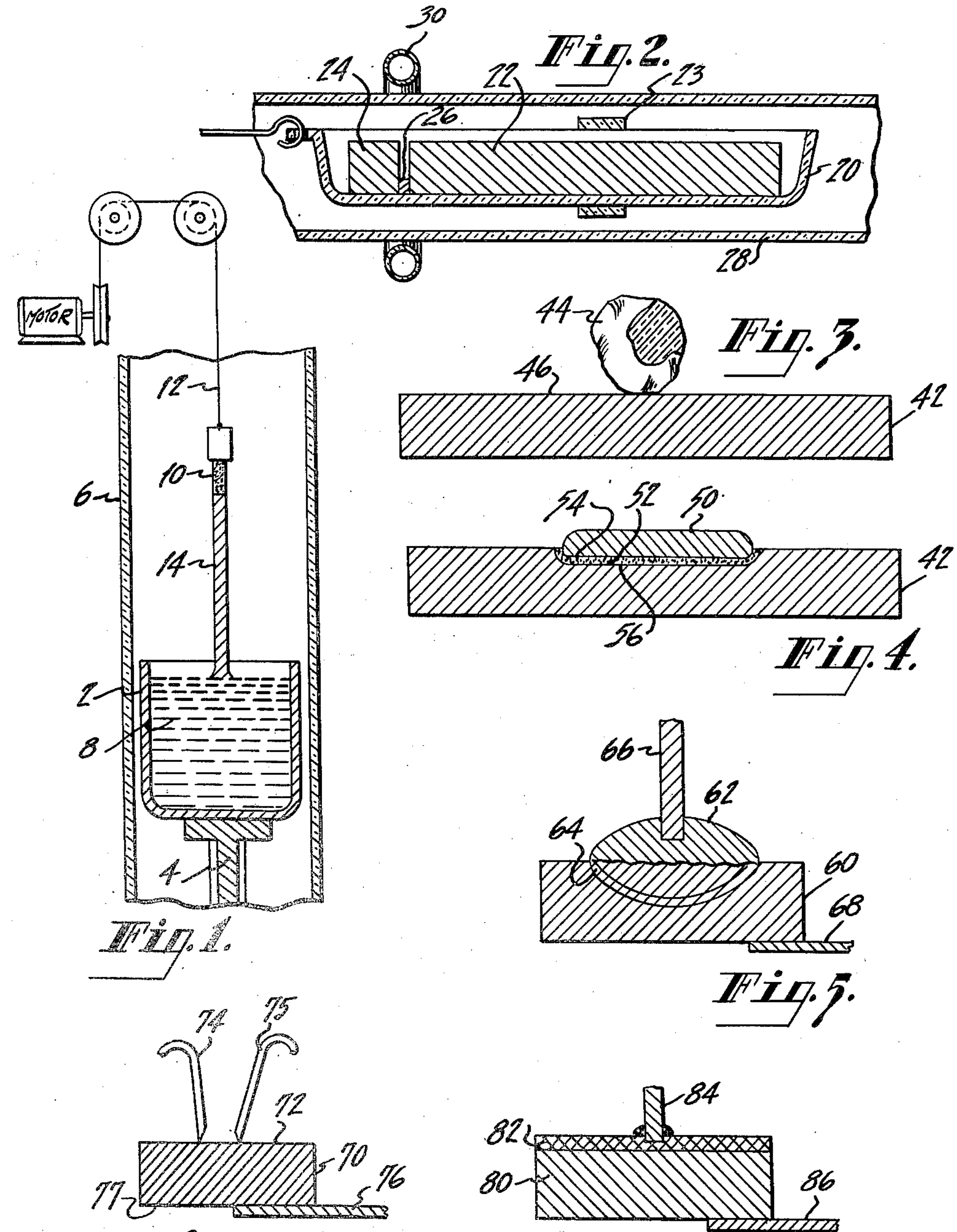
Figure 1 is a cross-sectional, elevational view of apparatus for vertically pulling a crystal from a melt.
Figure 2 is a cross-sectional, elevational view of an elongated crucible being drawn through an induction type furnace.
Figure 3 is an enlarged partial cross-sectional, elevational view of a semiconductive body and a pellet of a conductivity-type-determining impurity according to the invention prior to treatment in accordance with the invention.
Figure 4 is a cross-sectional, elevational view of the body and pellet of Figure 3 during and after treatment according to the invention.
Figure 5 is a cross-sectional, elevational view of an alloyed junction type semiconductor device utilizing the novel materials according to the invention.
Figure 6 is a cross-sectional, elevational view of a point contact semiconductor device utilizing the novel materials according to the invention.
Figure 7 is a cross-sectional, elevational view of a diffused junction type semiconductor device utilizing the novel materials according to the invention.

In manufacturing semiconductor devices it is generally desirable to produce a relatively large body of the semiconductor in single crystalline form so doped as to have a desirable resistivity and a particular type of conductivity. Such bodies are generally produced in elongated rod form and are termed "ingots." These bodies are thereafter cut up into many small wafers which are used as the semiconductor body in devices which will be described in greater detail hereinafter.

As pointed out previously, the addition of an excessive amount of an impurity renders the semiconductor so conductive that it loses its semiconducting character. Thus the resistivity desired ultimately dictates the amount of the impurity added to the semiconductor. In general it has been found that an impurity concentration in excess of $10^{-3}$, that is one impurity atom for every thousand atoms of the semiconductor (germanium or silicon), produces a semiconductor of too low a resistivity to be useful as a semiconductor. In fact it is questionable as to whether an element such as germanium or silicon when doped in excess of $10^{-3}$ atoms of impurity per atoms of host crystal can be properly termed a semiconductor. As stated, the desired resistivity for transistor devices lies between 0.1 and 10 ohm-cm. For rectifier devices the desired resistivity lies between 0.01 and 0.003 ohm-cms. When intrinsically pure germanium is doped so as to have one impurity atom for every one hundred million atoms (a concentration of $10^{-8}$) the resistivity of the germanium drops from 60 ohm-cm. (the resistivity of intrinsically pure germanium) to approximately 3.8 ohm-cm. Intrinsically pure silicon when doped to this concentration has a resistivity of about 10 ohm cms. For transistors the semiconductor should be doped to have an impurity concentration between $10^{-6}$ and $10^{-8}$ atoms of impurity per atoms of host crystal; rectifiers require an impurity concentration of less than $10^{-3}$ atoms of impurity per atoms of host crystal.

The conductivity-type-determining impurities according to the invention are "donors" or n-type impurities. In order to establish n-type conductivity in a semiconductor it is only necessary that the n-type impurity predominate over any incidental p-type impurities that may be present. Theoretically an excess of one atom of n-type impurity over p-type impurity is sufficient to establish n-type conductivity. It should be understood, however, that should the total amount of both types of impurities be present in a concentration greater than $10^{-3}$, the resistivity of the semiconductor will be too low to be useful for rectifiers and a concentration of both impurities greater than $10^{-6}$ renders the resistivity of the semiconductor too low for transistors. Hence when doping with the impurities according to the invention the total impurity concentration should be maintained within from $10^{-6}$ to $10^{-8}$ for transistor applications and less than $10^{-3}$ for rectifier operation. A semiconductor material containing such impurity concentrations is said to contain trace amounts of the impurity.

As explained, to establish resistivities in the range of from 0.001 to 10 ohm-cms., the impurity concentration should be between $10^{-3}$ and $10^{-8}$. To do this one needs to know what the initial impurity concentration of the semiconductor is and then add enough atoms of the impurity to establish the desired resistivity. By measuring the electrical resistivity of the semiconductor initially, one can determine the impurity concentration according to the following equation for germanium and silicon at room temperature $$R=\frac{1}{en\mu}$$

where R is the resistivity in ohm-cms., $e$ is the electronic charge, $n$ is the number of impurity atoms per cc., and $\mu$ is the mobility of the electrons in the semiconductor.

The number of atoms per gram of the materials involved according to the invention is as follows:

| Semiconductors: | Atoms/gram |
|---|---|
| Germanium | $0.82\times10^{22}$ |
| Silicon | $2.14\times10^{22}$ |
| Impurities: | |
| Sulfur | $1.9\times10^{22}$ |
| Selenium | $0.76\times10^{22}$ |
| Tellurium | $0.48\times10^{22}$ |

The following tables show how the semiconductors, germanium and silicon, are doped with the n-type impurities according to the invention. For the purposes of illustration it is assumed that the germanium and silicon contain no other impurity atoms whatever.

*Table I.—Germanium doped with* S, Se, *and* Te

| Impurity | Ge In Grams | Impurity In Grams | Concentration of Impurity Atoms in Ge |
|---|---|---|---|
| S | 82 | 0.019 | $2.3\times10^{-4}$ |
| Se | 82 | 0.0076 | $9.2\times10^{-5}$ |
| Te | 82 | 0.0048 | $5.8\times10^{-5}$ |

*Table II.—Silicon doped with* S, Se, *and* Te

| Impurity | Si In Grams | Impurity In Grams | Concentration of Impurity Atoms in Si |
|---|---|---|---|
| S | 214 | 0.019 | $8.8\times10^{-5}$ |
| Se | 214 | 0.0076 | $3.5\times10^{-5}$ |
| Te | 214 | 0.0048 | $2.2\times10^{-5}$ |

The semiconductor materials are preferably of single crystalline structure. Hence doping the semiconductors is described herein as an operation simultaneously performed with the process of producing single crystals from a melt. If it is desired to dope a semiconductor without regard to the single crystallinity of the material, it is only necessary to melt the material and add the impurity directly thereto in a quantity determined by the resistivity desired. Long single crystals of germanium and silicon in ingot form are grown generally by either of two methods which permit the simultaneous doping of the semiconductor materials. In one method a melt of the semiconductive material is provided and a single crystalline seed is contacted to the surface of the melt and slowly withdrawn. The impurity may be added to the melt. Apparatus for growing such a crystal and doping it according to the invention is shown in Figure 1. In Figure 1 a pot type crucible 2 which may be silica, for example, is supported by a pedestal 4 of fire-brick or other heat insulating material in a quartz container 6. The crucible may be heated by any conventional means (not shown). The crucible is charged with germanium 8, for example 50 grams, and a seed of single crystal germanium 10 attached to a withdrawing apparatus 12 is touched onto the surface of the molten germanium in the crucible. As the seed 10 is slowly withdrawn at a rate of about 0.5 cm. per hour or less, an elongated single crystal 14 is attached thereto. A conductivity-type-determining impurity according to the invention is added to the germanium melt in ingot, powder, or pellet form where it melts and diffuses through the molten mass. The amount of impurity added should be sufficient to establish a concentration of the impurity material in the germanium single crystal being grown in the range from $10^{-6}$ to $10^{-8}$. The precise amount of impurity material to be added depends upon the resistivity of the germanium initially melted. For example, if the germanium had an initial resistivity of 60 ohm-cms. then the impurity material should be added in the ratio of one atom of impurity to every one hundred million germanium atoms.

A more practical method to add impurities uniformly throughout a semiconductor single crystalline body may be accomplished by means of the apparatus shown in Figure 2. This process is called zone levelling or zone melting and takes advantage of the fact that impurity substances are more soluble in molten than in solid germanium or silicon, so that first frozen portions of a doping semiconductor body generally contain less impurity material than do later frozen portions. The general theory of zone levelling is discussed in an article by W. G. Pfann entitled "Principles of Zone Melting," published in the Journal of Metals, July 1952. The process, preferably, comprises causing a relatively narrow molten zone to traverse the length of an elongated body which is preferably disposed horizontally. The impurity material is placed initially in the molten zone and the segregation phenomenon is relied upon to distribute the impurity material relatively uniformly throughout the body as the molten zone is caused to traverse its length. The apparatus for accomplishing this is shown in Figure 2. An elongated boat-like crucible 20 of graphite is charged with a rod shaped piece of base material 22, such as germanium. A purified seed crystal 24 is placed at one end of the crucible close to but not in contact with the germanium charge. Between the seed crystal 24 and the germanium charge 22 a conductivity-type-determining impurity 26 is placed according to the invention.

The crucible is placed within a quartz tubular enclosure 28 and is gradually drawn, at about 2.5" per hour or less, through a ring shaped induction heating element 30 starting at the seed crystal end of the crucible. The crucible is supported within the enclosure 28 by a ring shaped member 23. At the start of the pulling operation, when the temperature reaches the melting point of the germanium, part of the seed 24 melts as well as all of the impurity material 26, and the adjacent portion of the germanium charge 22. The molten impurity diffuses throughout the melt and as the crucible with its contents is propelled through the heating element 30, successive segments of the charge 22 are melted. Recrystallization of the materials occurs as the crucible leaves the heat zone created by the heating element 30.

A third method for introducing the impurities into the semiconductor is by diffusion. This is accomplished by placing the semiconductor body (which may be already single crystalline) in an atmosphere composed of the impurity in its vapor state. The temperature of the semiconductor body should be elevated but still below its melting point, i. e., about 900° C. for germanium and about 1200° C. for silicon. The temperatures are not critical except where the semiconductor body is single crystalline: melting the semiconductor body and re-freezing it without seeding would result in converting it to a polycrystalline mass. In general, the temperature and time of diffusion determine the depth of penetration with the semiconductor body by the impurity atoms. It is generally not desirable to attempt to make a uniformly doped semiconductor by this method because of the relatively long time period required to diffuse the impurity throughout the mass of the semiconductor. Such a process, however, is applicable to establish a region or layer of n-type conductivity within a body of germanium or silicon which may be otherwise doped to have p-type conductivity. The formation of such an n-type layer in a p-type body actually results in the manufacture of a device such as will be described in greater detail. The diffusion technique of doping a crystal is distinct from the process of making a p–n rectifying junction by alloying. In the alloying process the impurity is placed on a surface of the semiconductor and heated to a temperature slightly higher than the melting point of the impurity. Upon melting, some of the impurity dissolves in the semiconductor and some of the semiconductor dissolves in the melted impurity. Cooling causes re-crystallization of the region resulting in the formation of a p–n rectifying junction (assuming the semiconductor to be of opposite conductivity to that of the impurity).

DEVICES

Figures 3 and 4 illustrate the p–n rectifying junction in germanium or silicon produced by an alloying process. Figure 3 shows a wafer 42 of p-type semiconducting germanium that has been purified until its resistivity is in excess of 30 ohm-cm. and then doped with sufficient indium or gallium to reduce its resistivity to about 5 ohm-cm. The wafer thus is of p-type conductivity. The wafer is about 0.25" x 0.25" x 0.02" in size. A pellet 44 of sulfur, for example, about 0.05" in diameter, is disposed upon a surface 46 of the wafer. Both wafer and pellet are heated together at about 250° C. for 10–20 minutes and cooled, producing the body shown in Figure 4.

In Figure 4 a small amount of the germanium has been dissolved in and throughout the sulfur 50, and a small amount of sulfur has been dissolved in the wafer 42 penetrating a small distance beneath the surface. The extent of the penetration of the sulfur is schematically shown by the stippled area 52. Adjacent to this area, on one side 54 is a body consisting principally of sulfur, having a small amount of germanium evenly dispersed through its volume. On the other side 56 is the body 42 of p-type semiconductive germanium containing essentially no sulfur. Within the area 52 the concentration of sulfur varies from a high value at the surface 54 to an extremely low value at the surface 56. Since sulfur is an n-type impurity and since the germanium wafer contains p-type impurities, the area 52 comprises a rectifying junction.

A complete alloy junction type device is shown in Figure 5. The device comprises a base wafer 60 of germanium or silicon doped with an n-type impurity according to the invention (sulfur, selenium or tellurium). The wafer may conveniently be 0.25" x 0.006" thick. A p-type electrode 62 which may be indium is fused to the surface of the wafer 60. Within the wafer there is disposed a p–n rectifying junction 64. The two electrical leads 66 and 68 make contact with the indium electrode 62 and a germanium wafer 60, respectively. The electrical leads 66 and 68 may be attached by non-rectifying solder connections. Thereafter, the device is etched, mounted, and potted according to conventional techniques utilized in conjunction with semiconductor devices.

Alternatively the device shown in Figure 5 may comprise a p-type base wafer of germanium which p-type conductivity may be established by such p-type impurities as indium, gallium, aluminum, zinc, or cadmium. The n-type electrode may be an n-type impurity according to the invention: that is, sulfur, selenium or tellurium.

A point contact semiconductor device suitable for high frequency operation is shown in Figure 6. This transistor comprises a base wafer 70 of n-type germanium which is doped according to the invention with sulfur, selenium or tellurium, for example, to a concentration of between $10^{-6}$ and $10^{-8}$. Upon the upper surface 72 of the wafer are pressed two closely spaced relatively hard pointed metallic wires 74 and 75. The ends of these wires are sharpened to chisel points so that the area of contact between the wires and the wafer are minimized. The ends of the wires contact the wafer at two points about 0.005" apart. One of the wires, for example 74, may be employed in a circuit as an emitter electrode, the other wire, for example 75, as a collector electrode. An electrical lead 76 which may serve as a base connection is soldered to the lower surface 77 of the wafer 70 so as to provide a non-rectifying connection thereto. For rectifier operation one of the point contact electrodes may be omitted and the semiconductor is doped so as to leave a resistivity of between 0.003 and 0.01 ohm-cms.

Referring to Figure 7, a diffusion junction device is illustrated. This junction device is made, according to the invention, by diffusing an n-type impurity according to the invention (sulfur, selenium or tellurium) into a p-type germanium or silicon body. The depth of penetration should be a few microns in order to obtain the most advantageous operation. A device employing a junction may according to this method comprise a wafer 80 of p-type germanium or silicon having a diffused surface region 82 consisting essentially of a transition from pure sulfur, selenium or tellurium to germanium or silicon. Terminals 84 and 86 are connected to the diffused junction region 82 into the wafer 80, respectively, by soldering for example. Alternatively the germanium or silicon wafer could be of n-type conductivity, which conductivity type is established by doping with sulfur, selenium or tellurium.

In this case indium or some other suitable p-type impurity is diffused into the n-type germanium wafer.

There has thus been described novel and useful semiconductor materials and methods for establishing a particular type of conductivity in germanium or silicon by novel conductivity-type-determining impurities. Several useful devices are described and shown utilizing the novel materials according to the invention.

What is claimed is:

1. An n-type semiconductive material consisting essentially of an element selected from the class consisting of germanium and silicon and having an n-type conductivity determining impurity material selected from the class consisting of sulfur, selenium, and tellurium, dispersed throughout its mass, the concentration of said impurity material in said semiconductive material being less than $10^{-3}$.

2. An n-type semiconductive material according to claim 1 wherein said impurity is sulfur.

3. An n-type semiconductive material according to claim 1 wherein said impurity is selenium.

4. An n-type semiconductive material according to claim 1 wherein said impurity is tellurium.

5. The n-type semiconductive material according to claim 1 characterized by being in single crystalline form.

6. An n-type semiconductive material according to claim 5 wherein said impurity material is sulfur.

7. An n-type semiconductive material according to claim 5 wherein said impurity material is selenium.

8. An n-type semiconductive material according to claim 5 wherein said impurity material is tellurium.

9. A semiconductive body consisting essentially of an element selected from the class consisting of germanium and silicon and having at least one n-type conductivity region therein, said n-type conductivity being due to the presence in said region of at least one impurity element selected from the class consisting of sulfur, selenium, and tellurium, the concentration of said impurity element in said region of said semiconductive body being less than $10^{-3}$.

10. A semiconductive body according to claim 9 wherein said impurity is sulfur.

11. A semiconductive body according to claim 9 wherein said impurity is selenium.

12. A semiconductive body according to claim 9 wherein said impurity is tellurium.

References Cited in the file of this patent

UNITED STATES PATENTS 2,691,577 Lark-Horovitz et al. ---- Oct. 12, 1954
2,739,088 Pfann ---------------- Mar. 20, 1956